United States Patent [19]
Defendorf

[11] 3,955,105
[45] May 4, 1976

[54] SYNCHRONOUS DETECTOR
[75] Inventor: James C. Defendorf, Rochester, N.Y.
[73] Assignee: Bausch & Lomb Incorporated, Rochester, N.Y.
[22] Filed: July 19, 1974
[21] Appl. No.: 489,862

[52] U.S. Cl.............................. 307/261; 307/233 R; 307/269; 328/133; 307/240
[51] Int. Cl.² .......................................... H03K 5/00
[58] Field of Search................ 307/231, 233 R, 240, 307/261, 269; 328/133

[56] References Cited
UNITED STATES PATENTS
3,517,213   6/1970   Britton.................................. 307/231
3,631,342  12/1971   McDonald....................... 307/261 X
3,828,259   8/1974   Riethmuller.................... 307/261 X Primary Examiner—John S. Heyman
Attorney, Agent, or Firm—Frank C. Parker; Bernard D. Bogdon

[57] ABSTRACT

A synchronous detector circuit provides a direct current output as a function of an alternating current input signal. Direct current and noise level in the input is removed in a circuit including filters and an operational amplifier and a parallel path feedback network, including in one branch a semiconductor and in a second branch a load and switching circuit synchronously operating with the alternating current input signal. The switching circuit may include a field-effect transistor switch made operative by a semiconductor switching off and on as a function of synchronously chopped light received by a photosemiconductor.

6 Claims, 2 Drawing Figures

SYNCHRONOUS DETECTOR

BACKGROUND OF THE INVENTION

1. Field of the Invention

This invention relates to a synchronous detector circuit and in particular to a synchronous detector circuit having a feedback path controlled by a switching field effect semiconductor.

2. Description of the Prior Art

Ordinary rectifier circuits are frequently too sensitive to signal noise level in specific applications. To adapt an ordinary rectifier circuit to a specific use where noise levels are at an extraordinary level, can be unduly costly. However, noise rejection improvements can be obtained with synchronous rectifiers and are well known in the art. Typical synchronous detection systems are illustrated in U.S. Pat. Nos. 3,517,213, 3,646,459 and 3,764,924.

SUMMARY OF THE INVENTION

An improved synchronous detector circuit is provided to economically replace ordinary rectifier circuits generally too sensitive to noise level in specific applications. To produce a direct current output signal which is a function of, and more specifically, proportional to the amplitude of an alternating current input signal, this invention provides a circuit including an amplifier and a dual parallel path feedback circuit, alternately conductive to provide feedback to the amplifier. A semiconductor is provided in one of the parallel paths and in the other a load element, across which the output signal is obtained, is in series with a switching apparatus operating in synchronism with the alternating current input signal. Synchronous switching of the switching apparatus provides feedback current alternately through each of the parallel paths forcing the input side on the amplifier to remain at virtual ground. Capacitive elements remove any direct current component from the input signal and the alternating current signals, including the noise, pass through the amplifier to the feedback circuit. The resulting direct current in the load is the input current multiplied by a synchronous square wave and is directly proportional to the amplitude of the input signal. The noise function has an average value of zero over a large number of switching periods.

DESCRIPTION OF THE PREFERRED EMBODIMENTS

Figure 1:
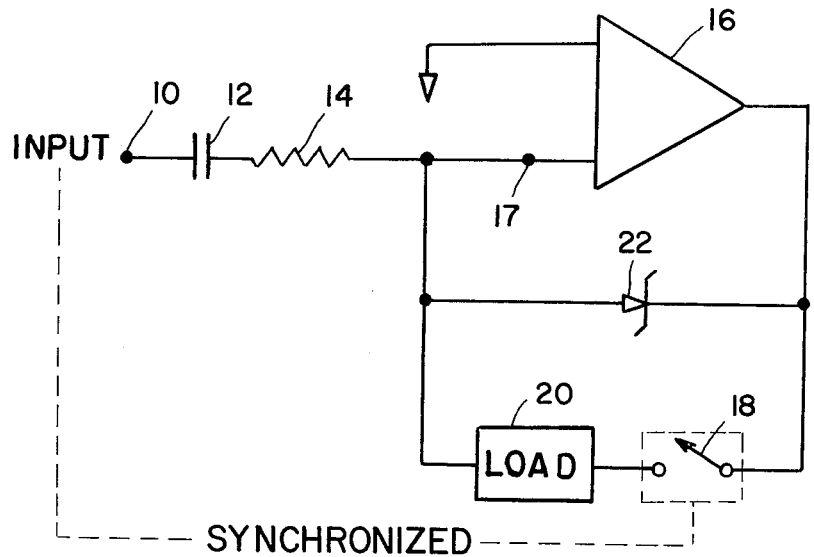
FIG. 1 is a schematically illustrated synchronous detector circuit according to the principles of the present invention.
Figure 2:
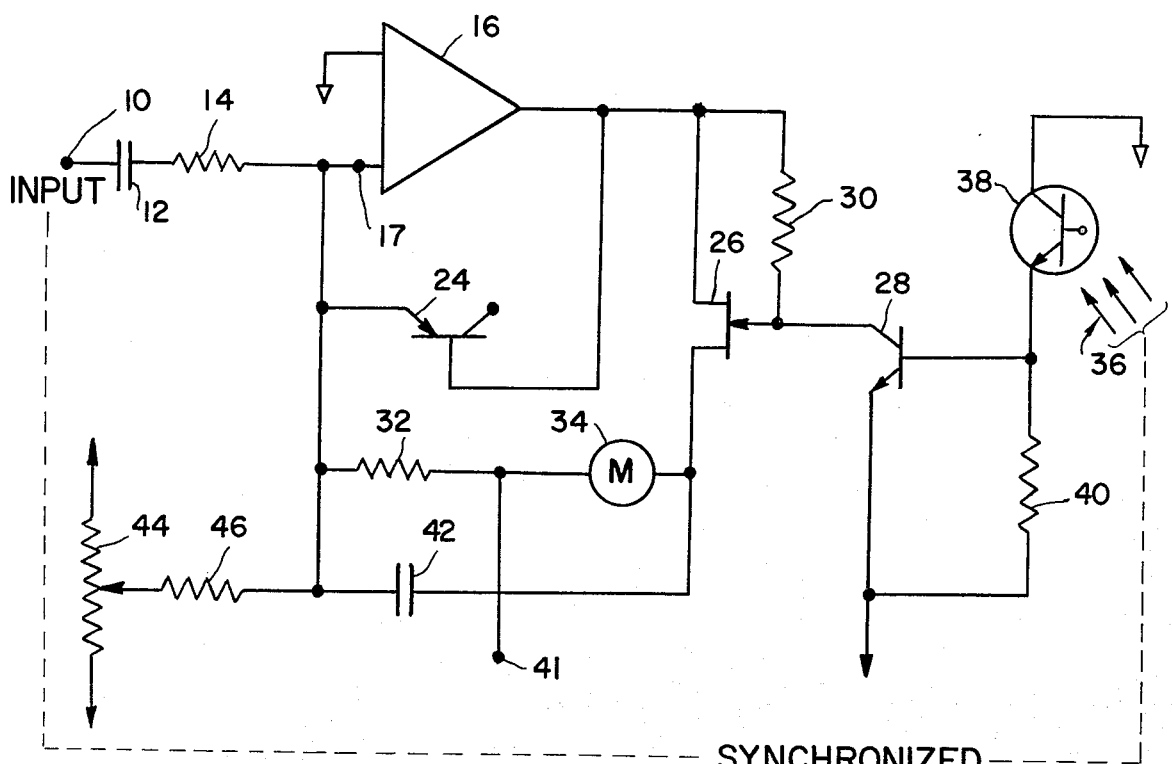
FIG. 2 is a further illustration of the circuit of FIG. 1 including detailed elements.

Embodiments to perform the function of the invention and to provide improved synchronous detectors are illustrated in FIGS. 1 and 2. With reference to FIG. 1, an alternating current input signal appears at input terminal 10. The alternating input signal generally includes direct current voltage level of the input signal is filtered by a capacitive element 12 and the resultant alternating voltage across a resistor 14 produces an alternating input current. The input current is introduced to an operational amplifier 16 at its negative input terminal 17. The output of the amplifier 16 is switched between two paths of an amplifier feedback system by a switching device 18 in the output circuit of the amplifier 16 which determines the path of the output current. If the switching device 18 is in a closed position, the current flows through a load 20 which defines one path of the feedback system. When the switching device 18 is open, the output current from the amplifier 16 passes to an alternate path of a feedback network including a semiconductor device 22 comprising, for example, a low voltage zener diode. When the switch is closed the current path is through the load 20 and remains that way as long as the feedback current does not develop enough voltage across load 20 for the zener diode to conduct.

With feedback provided through either path the negative input terminal of the amplifier 16 remains at virtual ground. Under these conditions, with capacitive element 12 of sufficiently large capacitive value to offer a low impedance path at the signal frequency, the direct current component of the input signal is removed and the alternating current signal and noise are passed. A current proportional to the signal and noise is produced at resistor 14. If the switching device 18 is operated synchronously with the input signal the product at the load 20 is a half-wave rectified alternating current signal current plus a noise function which averages out to zero.

A more specific embodiment to perform the operation and function of the schematically illustrated circuit of FIG. 1 is illustrated in FIG. 2 wherein, for example, the synchronous switching device 18 of FIG. 1 is illustrated in detail. In FIG. 2, one path of the amplifier feedback system includes a transistor 24 having reverse bias baseemitter junction breakdown characteristics similar to characteristics of a zener exemplary of the semiconductor device 22 of FIG. 1. To operate and function as a synchronous switching device a field-effect transistor 26 is utilized and is dependent upon the on-off condition of a transistor 28. When the transistor 28 is off, resistor 30 pulls the gate of field-effect transistor 30 up to a voltage equal to its source voltage and turns field-effect transistor 30 on thereby offering a low resistance path through a second path of the amplifier feedback system which path contains a load resistor 28 and a metering device 34. When the transistor 38 is on, it pulls the voltage level at the gate of field-effect transistor 26 down and, as a consequence, turns it off. Any offset voltage or non-zero resistance in the switching device, when closed, does not significantly affect the half-wave rectified signal current in the load.

The transistor 28 is turned on and off in synchronism with the light or electromagnetic radiation identified by rays 36 impinging upon a phototransistor 38. Typically the light varies the resistance of the photoresistor element 38 to affect the conducting state of the transistor 28. A resistor 40 biases photoresistor 38 and transistor 28 so that the switching wave form has a 50% duty cycle.

The resultant direct current in the load resistor 32 is proportional to the input signal amplitude and flows in metering device 34 to provide a reading proportional to the input signal amplitude. The voltage across the loading resistor 32 provides the output signal available for example at terminal 41. A capacitor 42 connected in parallel with the loading resistor 32 and metering device 34 filters out any ripple in the switch load current to provide a smooth direct current output.

To bias the amplifier 16 so that the amplifier 16 is normally balanced and no offset current flows in the load resistor 32 due to the switching network, a potentiometer 44 including a tap resistor 46 is provided.

It is claimed:

1. A synchronous detector circuit for providing a direct current output signal as a function of an alternating current input signal, comprising:
   an operational amplifier having an input summing junction and an output terminal;
   feedback circuit means including a semiconductor connected between the input summing junction and the output terminal of the amplifier;
   a current load element connected to the summing junction; and
   switching means connected to the current load element and the output terminal of the amplifier for alternately providing current flow through the semiconductor and the current load element in synchronism with the alternating current input signal to produce a direct current output voltage signal across the current load element as a function of the alternating current input signal.

2. The synchronous detector circuit as defined in claim 1, wherein the semiconductor of the feedback circuit means is a zener diode.

3. The synchronous detector circuit as defined in claim 1, wherein the semiconductor of the feedback circuit means is a base-emitter transistor circuit.

4. The synchronous detector circuit as defined in claim 1, wherein the switching means includes a field-effect transistor for operating synchronously with the alternating current input signal.

5. The synchronous detector circuit as defined in claim 4, wherein the switching means further includes a photo-transistor for receiving light synchronously with the alternating current input signal to operate a transistor to synchronously switch the field-effect transistor.

6. The synchronous detector circuit as defined in claim 1, further including a capacitive element for filtering out direct current components carried by the alternating current input signal.

* * * * *

UNITED STATES PATENT OFFICE
CERTIFICATE OF CORRECTION

PATENT NO. : 3,955,105
DATED : May 4, 1976
INVENTOR(S) : James C. Defendorf

It is certified that error appears in the above-identified patent and that said Letters Patent are hereby corrected as shown below:

Column 2, line 45, change "28" to --32--;
line 46, change "38" to --28--.

Signed and Sealed this

Thirteenth Day of July 1976

[SEAL]

Attest:

RUTH C. MASON
Attesting Officer

C. MARSHALL DANN
Commissioner of Patents and Trademarks